United States Patent
Inari et al.

(10) Patent No.: US 10,976,663 B2
(45) Date of Patent: Apr. 13, 2021

(54) PHOTOSENSITIVE COMPOSITION, COLORED PATTERN AND METHOD FOR PRODUCING SAME

(71) Applicant: KANEKA CORPORATION, Osaka (JP)

(72) Inventors: Hirofumi Inari, Settsu (JP); Susumu Amano, Settsu (JP); Aki Kitajima, Settsu (JP); Yoshikatsu Ichiryu, Settsu (JP); Masahito Ide, Settsu (JP); Takao Manabe, Settsu (JP)

(73) Assignee: KANEKA CORPORATION, Osaka (JP)

( * ) Notice: Subject to any disclaimer, the term of this patent is extended or adjusted under 35 U.S.C. 154(b) by 157 days.

(21) Appl. No.: 16/337,470

(22) PCT Filed: Sep. 21, 2017

(86) PCT No.: PCT/JP2017/034150
§ 371 (c)(1),
(2) Date: Mar. 28, 2019

(87) PCT Pub. No.: WO2018/061988
PCT Pub. Date: Apr. 5, 2018

(65) Prior Publication Data
US 2019/0235383 A1    Aug. 1, 2019

(30) Foreign Application Priority Data

Sep. 29, 2016 (JP) .............................. JP2016-191557

(51) Int. Cl.
| | | |
|---|---|---|
| G03F 7/075 | (2006.01) | |
| G03F 7/004 | (2006.01) | |
| G03F 7/038 | (2006.01) | |
| C08G 77/388 | (2006.01) | |
| G02B 5/20 | (2006.01) | |
| C08G 59/20 | (2006.01) | |

(52) U.S. Cl.
CPC ........... *G03F 7/0757* (2013.01); *C08G 59/20* (2013.01); *G02B 5/20* (2013.01); *G03F 7/004* (2013.01); *G03F 7/0045* (2013.01); *G03F 7/038* (2013.01); *C08G 77/388* (2013.01)

(58) Field of Classification Search
CPC ...... G03F 7/0757; G03F 7/105; G03F 7/0045; G03F 7/0007; C08K 5/549; C08G 77/388
See application file for complete search history.

(56) References Cited

U.S. PATENT DOCUMENTS

| | | | |
|---|---|---|---|
| 2004/0186202 A1 | 9/2004 | Klettke et al. | |
| 2007/0166511 A1* | 7/2007 | Wang | G03F 7/0007 |
| | | | 428/137 |
| 2011/0001190 A1* | 1/2011 | Ide | H01L 29/78609 |
| | | | 257/347 |

FOREIGN PATENT DOCUMENTS

| | | | |
|---|---|---|---|
| EP | 1 679 328 A1 | | 7/2006 |
| EP | 2 343 326 A1 | | 7/2011 |
| JP | 2000-327980 | | 11/2000 |
| JP | 2007-71994 A | | 3/2007 |
| JP | 4029043 B2 | | 1/2008 |
| JP | 2010-285518 A | | 12/2010 |
| JP | 2011-2711 A | | 1/2011 |
| JP | 2013-28724 A | | 2/2013 |
| JP | 2016-71245 A | | 5/2016 |
| JP | 2016071245 A | * | 5/2016 |
| WO | WO 2009/075233 A1 | | 6/2009 |

OTHER PUBLICATIONS

English Machine Translation of Kashiwagi JP-2016071245-A (May 2016) (Year: 2016).*
International Search Report dated Dec. 5, 2017 in PCT/JP2017/034150 filed on Sep. 21, 2017.
International Preliminary Report on Patentability and Written Opinion dated Apr. 11, 2019 in PCT/JP20171034150, 9 pages.
Office Action dated Feb. 4, 2021, in Taiwanese patent application No. 106133255, 9 pages.

* cited by examiner

*Primary Examiner* — John A McPherson
*Assistant Examiner* — Nicholas E Brown
(74) *Attorney, Agent, or Firm* — Oblon, McClelland, Maier & Neustadt, L.L.P.

(57) ABSTRACT

A photosensitive composition contains a polysiloxane compound, a photoacid generator, a coloring agent and a solvent. A content of the coloring agent with respect to a total solid content of the composition is 5% by weight or more. The polysiloxane compound contains a cyclic polysiloxane structure and a cationically polymerizable functional group. The polysiloxane compound may further have an alkali-soluble functional group. A content of the polysiloxane compound with respect to the total solid content of the composition is preferably 20-80% by weight. The photosensitive composition is used, for example, in formation of a colored pattern.

17 Claims, 1 Drawing Sheet

PHOTOSENSITIVE COMPOSITION, COLORED PATTERN AND METHOD FOR PRODUCING SAME

CROSS-REFERENCE TO RELATED APPLICATIONS

The present application is a 35 U.S.C. § 371 national stage patent application of International patent application PCT/JP2017/034150, filed on Sep. 21, 2017, which is based on and claims the benefits of priority to Japanese Application No. 2016-191557, filed on Sep. 29, 2016. The entire contents of these applications are incorporated herein by reference.

TECHNICAL FIELD

The present invention relates to a photosensitive composition containing a coloring agent. Further, the present invention relates to a colored pattern using the photosensitive composition and a method for producing the colored pattern.

TECHNICAL BACKGROUND

A partition wall or the like between pixels of a color filter used in a liquid crystal display or between pixels of a black matrix or a display element such as an organic EL display is required to have performance capable of absorbing and shielding light even for a thin film of a thickness of about 1-3 μm. For forming such a colored pattern, a photosensitive composition in which a coloring agent such as a pigment or a dye is added to a binder such as an alkali-soluble acrylic resin has excellent patternability (photosensitivity and alkali developability) by photolithography, and thus is used (for example, Patent Document 1). Patent Document 2 describes that, by introducing a siloxane structure to an acrylic resin, heat resistance of a colored pattern such as a color filter is improved.

RELATED ART

Patent Documents

Patent Document 1: Japanese Patent Laid-Open Publication No. 2007-71994.
Patent Document 2: Japanese Patent Laid-Open Publication No. 2011-2711.

SUMMARY OF THE INVENTION

Problems to be Solved by the Invention

A conventional colored photosensitive resin composition has room for improvement in heat resistance and the like. As described in Patent Document 2, there is a tendency that the heat resistance is improved by introducing a siloxane structure. However, in a photosensitive resin composition containing a coloring agent, along with a structural change of a binder polymer, dispersibility of the coloring agent or alkali developability may be reduced and patternability may deteriorate. In particular, when a content of the coloring agent is increased in order to improve a light shielding property, the tendency is prominent.

The present invention is accomplished in view of the above-described situation, and is intended to provide a photosensitive composition capable of allowing a thin film to be formed having a light shielding property and having excellent heat resistance and patternability.

Means for Solving the Problems

The present invention is accomplished based on findings that a composition using as a binder a cyclic polysiloxane compound in which a predetermined functional group is introduced has high heat resistance and is excellent in various properties such as dispersibility of a coloring agent.

A photosensitive composition of the present invention contains a polysiloxane compound (A), a photoacid generator (B), a coloring agent (C) and a solvent. A content of the coloring agent (B) with respect to a total solid content of the composition is 5% by weight or more. The polysiloxane compound (A) contains a cyclic polysiloxane structure and a cationically polymerizable functional group. A content of the polysiloxane compound (A) with respect to the total solid content of the composition is preferably 20-80% by weight.

Examples of the cationically polymerizable functional group in the polysiloxane compound (A) include an epoxy group, an alkoxysilyl group, a vinyl ether group, and the like. The polysiloxane compound (A) preferably has an alicyclic epoxy group as the cationically polymerizable functional group. The polysiloxane compound (A) preferably contains a glycidyl group in addition to the alicyclic epoxy group as the cationically polymerizable functional group.

The polysiloxane compound (A) preferably further has an alkali-soluble functional group. Examples of the alkali-soluble group include a phenolic hydroxyl group, a carboxyl group, and an isocyanuric acid derivative structure represented by the following X1 or X2.

[Chemical Formula 1]

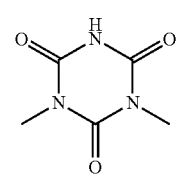

X1

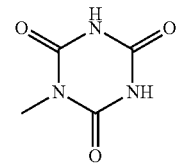

X2

The photosensitive composition may further contain a reactive diluent (D). The reactive diluent has two or more cationically polymerizable functional groups in one molecule. Among these, a reactive diluent containing alicyclic epoxy groups as the cationically polymerizable functional groups is preferable. A content of the reactive diluent (D) with respect to the total solid content of the composition is preferably 5-75% by weight.

Further, the present invention relates to a colored pattern formed of a cured product of the photosensitive composition and a method for producing the colored pattern.

Effect of Invention

The photosensitive composition of the present invention has a light shielding property and is excellent in heat resistance and patternability, and thus can be suitably used as a colored pattern formation material for a partition wall or the like between pixels of a black matrix or a display element.

MODE FOR CARRYING OUT THE INVENTION

Figure 1A:
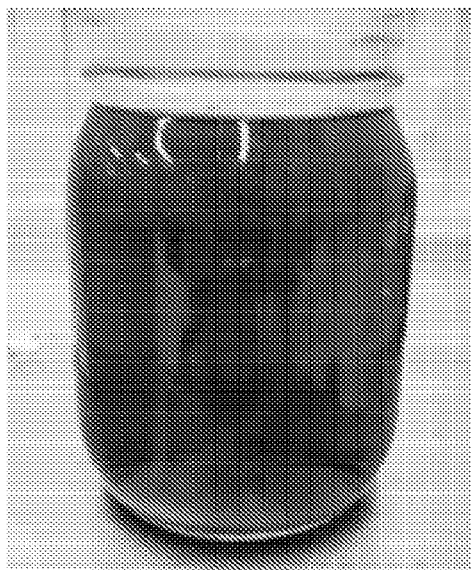
FIGS. 1A and 1B each show an observation picture of an alkali developer after a colored film was developed.

An embodiment of the present invention is described in detail in the following. In the present specification, "A-B" representing a numerical range means "A or more and B or less". Components, functional groups, and the like exemplified in the present specification may each be used alone, or two or more of them may be used in combination (coexist), unless otherwise specified.

Photosensitive Composition

A photosensitive composition of the present invention contains, as a solid content, (A) a cyclic polysiloxane compound having a cationically polymerizable functional group, (B) a photoacid generator, and (C) a coloring agent. The term "solid content" refers to a nonvolatile component in the composition, and the term "total solid content" means a total amount excluding a solvent from the components of the composition.

(A) Polysiloxane Compound

The photosensitive composition contains as a resin binder component a cyclic polysiloxane compound having a cationically polymerizable functional group. In the following, the cyclic polysiloxane compound having a cationically polymerizable functional group may be referred to as a "compound (A)". The compound (A) has a cyclic polysiloxane structure and a cationically polymerizable functional group.

In the present specification, the term "cyclic polysiloxane structure" means a cyclic molecular structure skeleton having a siloxane unit (Si—O—Si) in a structural element of a ring. As compared to a compound containing only a linear polysiloxane structure, a compound containing a cyclic polysiloxane structure tends to be excellent in film formability and in heat resistance of a resulting cured product. The compound (A) may contain the cyclic polysiloxane structure in a main chain or a side chain. When the compound (A) contains the cyclic polysiloxane structure in a main chain, a cured product tends to be excellent in heat resistance. The cyclic polysiloxane structure may be a monocyclic structure or a polycyclic structure. A polycyclic structure may be a polyhedral structure. When a content rate of a T unit ($XSiO_{3/2}$) or a Q unit ($SiO_{4/2}$) among siloxane units forming a ring is higher, a resulting cured product tends to have a higher hardness and be more excellent in heat resistance. When a content rate of an M unit ($X_3SiO_{1/2}$) or a D unit ($X_2SiO_{2/2}$) is higher, a resulting cured product tends to be more flexible and lower in stress.

In the present specification, the term "cationically polymerizable functional group" means a functional group that, when being irradiated with active energy ray, polymerizes and crosslinks by an acidic active substance generated from a photoacid generator. Examples of the active energy ray include visible light, ultraviolet ray, infrared ray, X ray, α ray, β ray, γ ray, and the like. Examples of the cationically polymerizable functional group include an epoxy group, a vinyl ether group, an oxetane group, and an alkoxysilyl group. From a point of view of stability, the compound (A) preferably has an epoxy group as the cationically polymerizable functional group. Among epoxy groups, from a point of view of stability, an alicyclic epoxy group or a glycidyl group is preferable. In particular, an alicyclic epoxy group is excellent in photo cationic polymerizability and thus is preferable.

The compound (A) may have multiple cationically polymerizable functional groups in one molecule. When the compound (A) has multiple cationically polymerizable functional groups in one molecule, there is a tendency that a cured product having a high crosslink density is obtained and heat resistance improves. The multiple cationically polymerizable functional groups may be the same or two or more different functional groups.

The compound (A) may contain an alicyclic epoxy group and a glycidyl group in one molecule. As will be described in detail later, when the compound (A) has an alicyclic epoxy group and a glycidyl group in one molecule, mainly the alicyclic epoxy group is involved in cationic polymerization, and the glycidyl group contributes to improvement in dispersibility of the coloring agent.

In addition to a cationically polymerizable functional group, the compound (A) may have an alkali-soluble functional group. In the present specification, the term "alkali-soluble functional group" means a functional group that imparts alkali solubility to a compound. The compound (A) exhibits solubility in an alkali aqueous solution by having an alkali-soluble functional group in addition to a cationically polymerizable functional group in the same molecule. As a result, the photosensitive composition containing the compound (A) can be applied as a colored pattern formation material (colored negative type photosensitive composition) for which patterning by alkali development is possible.

Examples of the alkali-soluble functional group include an isocyanuric acid derivative structure represented by the following X1 or X2, a phenolic hydroxyl group, a carboxyl group, and the like. From a point of view of heat resistance or the like of a resulting cured product, the compound (A) preferably has a structure represented by the following formula X1 or X2 as the alkali-soluble functional group.

[Chemical Formula 2]

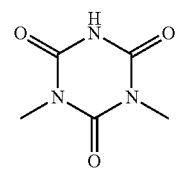

X1

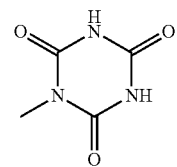

X2

A method for introducing a cationically polymerizable functional group into a polysiloxane-based compound is not particularly limited. Since a cationically polymerizable functional group can be introduced into a polysiloxane-based compound by a chemically stable silicon-carbon bond (Si—C bond), a method using a hydrosilylation reaction is preferable. In other words, the compound (A) is preferably a cyclic polysiloxane compound which is organically modified by a hydrosilylation reaction and into which a cationically polymerizable functional group is introduced via a silicon-carbon bond. An alkali-soluble functional group is preferably also introduced into the cyclic polysiloxane-based compound via a silicon-carbon bond by the hydrosilylation reaction.

A cyclic polysiloxane compound into which a cationically polymerizable functional group and an alkali-soluble functional group are introduced is obtained, for example, by a hydrosilylation reaction using the following compounds as starting substances:

(α) a compound having a carbon-carbon double bond reactive with a SiH group (hydrosilyl group) and an alkali-soluble functional group in one molecule;

(β) a cyclic polysiloxane compound having at least two SiH groups in one molecule; and (γ) a compound having a carbon-carbon double bond reactive with a SiH group, and a cationically polymerizable functional group in one molecule.

Compound (α)

The compound (α) is not particularly limited as long as the compound (α) is an organic compound having a carbon-carbon double bond reactive with a SiH group and an alkali-soluble functional group in one molecule; By using the compound (α), an alkali-soluble functional group is introduced into the compound (A).

Examples of a group containing a carbon-carbon double bond reactive with a SiH group (hereinafter, may be simply referred to as an "alkenyl group") include a vinyl group, an allyl group, a methallyl group, an acrylic group, a methacryl group, a 2-hydroxy-3-(allyloxy) propyl group, a 2-allylphenyl group, a 3-allylphenyl group, a 4-allylphenyl group, a 2-(allyloxy)phenyl group, a 3-(allyloxy) phenyl group, a 4-(allyloxy) phenyl group, a 2-(allyloxy) ethyl group, a 2,2-bis (allyloxymethyl) butyl group, a 3-allyloxy-2,2-bis (allyloxymethyl) propyl group, a vinyl ether group, and the like. From a point of view of reactivity with a SiH group, the compound (α) preferably contains a vinyl group or an allyl group as an alkenyl group.

The compound (α) may have two or more alkenyl groups in one molecule. When the compound (α) contains multiple alkenyl groups in one molecule, multiple compounds (β) can be crosslinked by a hydrosilylation reaction, and thus there is a tendency that a crosslink density of a resulting cured product is high and heat resistance improves.

From a point of view of availability, the compound (α) is preferably a diallyl isocyanuric acid, a monoallyl isocyanuric acid, a vinyl phenol, an allyl phenol, a compound represented by the following general formula (IIa) or (IIb), a butenoic acid, a pentenoic acid, a hexene acid, a heptenoic acid or an undecylenic acid. R in the following general formulas (IIa) and (IIb) is a divalent group selected from a group consisting of —O—, —CH$_2$—, —C(CH$_3$)$_2$—, —C(CF$_3$)$_2$—, and —SO$_2$—.

[Chemical Formula 3]

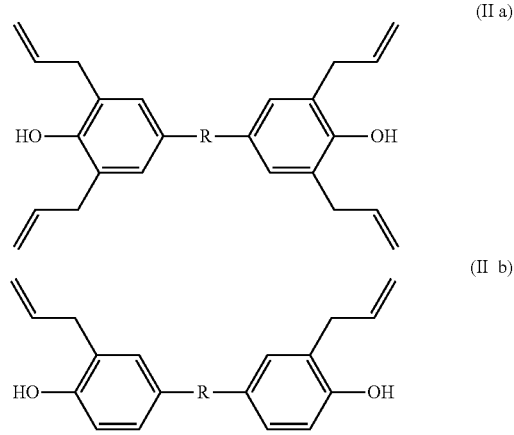

Among these compounds, from a point of view of heat resistance of a cured product, the compound (α) is preferably a diallyl isocyanuric acid, a monoallyl isocyanuric acid, a diallyl bisphenol A, a diallyl bisphenol S, a vinyl phenol or an allyl phenol. Further, from a point of view of electrical characteristics or the like of a cured product, the compound (α) is particularly preferably a diallyl isocyanuric acid or a monoallyl isocyanuric acid. By using a diallyl isocyanuric acid as the compound (α), the above-described structure X1 is introduced into the compound (A). The structure X2 has a higher acidity (low pKa) as compared to the structure X1. Therefore, when a monoallyl isocyanuric acid is used, alkali developability tends to improve.

When a monoallyl isocyanuric acid is used as the compound (α), in order to increase a molecular weight and a crosslink density of the compound (A), a compound (for example, a compound (δ) to be described later) having two or more alkenyl groups in one molecule is preferably combinedly used. As the compound (α), a diallyl isocyanuric acid and a monoallyl isocyanuric acid may be used in combination.

Compound (β)

The compound (β) is a cyclic polysiloxane compound having at least two SiH groups in one molecule. For example, in a compound described in International Publication No. 96/15194, a compound or the like having at least two SiH groups in one molecule can be used. The compound (β) preferably contains three or more SiH groups in one molecule. From a point of view of heat resistance and light resistance, a group existing in a Si atom is preferably either a hydrogen atom or a methyl group.

The compound (β) is, for example, a cyclic polysiloxane represented by the following general formula (III).

[Chemical Formula 4]

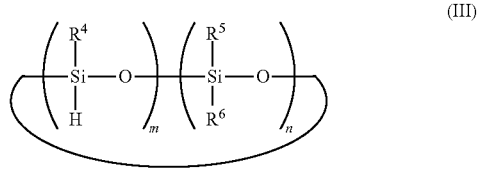

$R^4$, $R^5$ and $R^6$ in the formula each independently represent an organic group having 1-20 carbon atoms. m represents an integer of 2 to 10, and n represents an integer of 0 to 10. m is preferably 3 or larger. m+n is preferably 3 to 12.

As $R^4$, $R^5$ and $R^6$, organic groups formed by elements selected from a group consisting of C, H and O are preferable. Examples of $R^4$, $R^5$ and $R^6$ include an alkyl group, a hydroxyalkyl group, an alkoxyalkylkyl group, an oxyalkyl group, an aryl group, and the like. Among these, chain alkyl groups such as a methyl group, an ethyl group, a propyl group, a hexyl group, an octyl group, a decyl group and a dodecyl group, a cyclic alkyl group such as a cyclohexyl group and a norbornyl group, or a phenyl group are preferable. From a point of view of availability of the compound (β), $R^4$, $R^5$ and $R^6$ are preferably each a methyl group, a propyl group, a hexyl group or a phenyl group. $R^4$ and $R^5$ are more preferably each a chain alkyl group having 1-6 carbon atoms, and a methyl group is particularly preferable.

Examples of the cyclic polysiloxane compound represented by the general formula (III) include 1,3,5,7-tetrahydrogen-1,3,5,7-tetramethylcyclotetrasiloxane, 1-propyl-3,5,7-trihydrogen-1,3,5,7-tetramethylcyclotetrasiloxane, 1,5-dihydrogen-3,7-dihexyl-1,3,5,7-tetramethylcyclotetrasiloxane, 1,3,5-trihydrogen-1,3,5-trimethylcyclosiloxane, 1,3,5,7,9-pentahydrogen-1,3,5,7,9-pentamethylcyclosiloxane, 1,3,5,7,9,11-hexahydrogen-1,3,5,7,9,11-hexamethylcyclosiloxane, and the like. Among these compounds, from a point of view of availability and reactivity with a SiH group, 1,3,5,7-tetrahydrogen-1,3,5,7-tetramethylcyclotetrasiloxane (in the general formula (III), m=4, n=0 and $R^4$ is a methyl group) is preferable.

The compound (β) may be a polycyclic cyclic polysiloxane. A polycyclic ring may be a polyhedral structure. In a polysiloxane having a polyhedron skeleton, the number of Si atoms forming a polyhedron skeleton is preferably 6-24, and more preferably 6-10. A specific example of a polysiloxane having a polyhedron skeleton is a silsesquioxane (the number of Si atoms=8) represented by the following general formula (IV).

[Chemical Formula 5]

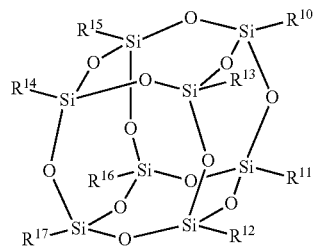

(IV)

In the above formula, $R^{10}$-$R^{17}$ are each independently a monovalent group selected from a hydrogen atom, chain alkyl group (such as a methyl group, an ethyl group, a propyl group and a butyl group), cycloalkyl groups (such as a cyclohexyl group), aryl groups (such as a phenyl group and a tolyl group), groups (such as a chloromethyl group, a trifluoropropyl group and a cyanoethyl group) obtained by substituting some or all of hydrogen atoms bonded to carbon atoms of these groups with halogen atoms or cyano groups or the like, alkenyl groups (such as a vinyl group, an allyl group, a butenyl group and a hexenyl group), a (meth) acryloyl group, an epoxy group, an organic group containing a mercapto group or an amino group, and the like. The number of carbon atoms of the above-described hydrocarbon groups is preferably 1-20, and more preferably 1-10. A cyclic polysiloxane having a polyhedron skeleton has two or more hydrosilyl groups which are reactive groups of a hydrosilylation reaction. Therefore, at least two of $R^{10}$-$R^{17}$ are hydrogen atoms.

The cyclic polysiloxane may be a silylated silicic acid having a polyhedron skeleton. A specific example of the silylated silicic acid having a polyhedron skeleton is a compound (the number of Si atoms=8) represented by the following general formula (V).

[Chemical Formula 6]

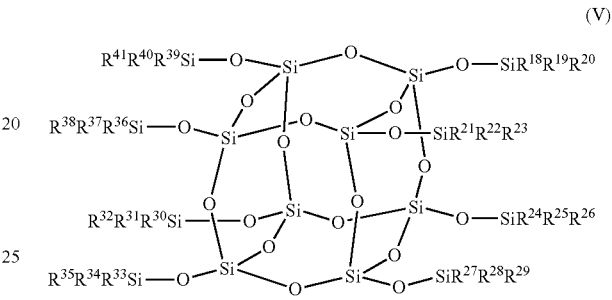

(V)

In the above formula, $R^{18}$-$R^{41}$ are the same as the specific examples of $R^{10}$-$R^{17}$ in the above-described general formula (IV), and at least two of $R^{18}$-$R^{41}$ are hydrogen atoms.

In a silylated silicic acid having a polyhedron skeleton, Si atoms and SiH groups (reactive groups of a hydrosilylation reaction) forming the polyhedron skeleton are bonded via siloxane bonds. Therefore, flexibility can be imparted to a cured product.

A cyclic polysiloxane can be obtained using a commonly known synthesis method. For example, the cyclic polysiloxane represented by the general formula (III) can be synthesized using a method described in International Publication No. 96/15194 or the like. A polysiloxane having a polyhedron skeleton such as a silsesquioxane and a silylated silicic acid having a polyhedron skeleton can be synthesized, for example, using methods described in Japanese Patent Laid-Open Publication No. 2004-359933, Japanese Patent Laid-Open Publication No. 2004-143449, Japanese Patent Laid-Open Publication No. 2006-269402, and the like. As the compound (β), a commercially available cyclic polysiloxane compound may be used.

Compound (γ)

The compound (γ) is not particularly limited as long as the compound (γ) is a compound having an alkenyl group and a cationically polymerizable functional group in one molecule. By using the compound (γ), a cationically polymerizable functional group is introduced into the compound (A). Therefore, the cationically polymerizable functional group in the compound (γ) is identical to the above-described cationically polymerizable functional group of the compound (A), and a preferred embodiment is also the same. The alkenyl group in the compound (γ) is preferably the same as the above-described alkenyl group in the compound (α).

Specific examples of the compound (γ) having an epoxy group as a cationically polymerizable functional group include vinyl cyclohexene oxide, allyl glycidyl ether, diallyl monoglycidyl isocyanurate, monoallyl diglycidyl isocyanurate, and the like. From a point of view of reactivity in photo cationic polymerization, a compound having an alicyclic epoxy group is preferable, and vinyl cyclohexene oxide is particularly preferable.

The cationically polymerizable functional group of the compound (γ) may be a vinyl ether group, an oxetane group, an alkoxysilyl group, and the like. Specific examples of the compound (γ) having an alkoxysilyl group as a cationically polymerizable functional group include alkoxysilanes such as trimethoxyvinylsilane, triethoxyvinylsilane, methyldiethoxyvinylsilane, methyldimethoxyvinylsilane, phenyldimethoxyvinylsilane, and the like. Examples of the compound (γ) having a vinyl ether group as a cationically polymerizable functional group include propenyl ethenyl ether and the like. Examples of the compound (γ) having an oxetane group as a cationically polymerizable functional group include 2-vinyloxetane, 3-allyloxyoxetane, (3-ethyloxetan-3-yl) methyl acrylate, and the like.

Other Starting Substances

In the synthesis of the compound (A) by a hydrosilylation reaction, in addition to the above-described compounds (α) (β) (γ), other starting substances may be used. For example, as a starting substance, the compound (δ): a compound having two or more alkenyl groups in one molecule (however, except for the compound (α) and the compound (γ)) may be used. When the compound (δ) containing multiple alkenyl groups in one molecule is used as a starting substance, multiple compounds (β) are crosslinked by a hydrosilylation reaction, and thus, there is a tendency that the molecular weight of the compound (A) is increased, and film formability and heat resistance of a cured film are improved.

The compound (δ) may be either an organic polymer-based compound or an organic monomer-based compound. Examples of the organic polymer-based compound include polyether-based, polyester-based, polyallylate-based, polycarbonate-based, saturated hydrocarbon-based, unsaturated hydrocarbon-based, polyacrylic acid ester-based, polyamide-based, phenol-formaldehyde-based (phenol resin-based) or polyimide-based compounds. Examples of the organic monomer-based compound include, for example, phenol-based compounds, bisphenol-based compounds, aromatic hydrocarbon-based compounds such as benzene or naphthalene; aliphatic hydrocarbon-based compounds such as linear and alicyclic compounds; and heterocyclic compounds.

Specific examples of the compound (δ) include diallyl phthalate, triallyl trimellitate, diethylene glycol bisallyl carbonate, trimethylolpropane diallyl ether, trimethylolpropane triallyl ether, pentaerythritol triallyl ether, pentaerythritol tetraallyl ether, 1,1,2,2-tetraallyloxyethane, diarylidene pentaerythritol, triallyl cyanurate, triallyl isocyanurate, diallyl monobenzyl isocyanurate, diallyl monomethyl isocyanurate, 1,2,4-trivinylcyclohexane, 1,4-butanediol divinyl ether, nonanediol divinyl ether, 1,4-cyclohexanedimethanol divinyl ether, triethylene glycol divinyl ether, trimethylolpropane trivinyl ether, pentaerythritol tetravinyl ether, diallyl ether of bisphenol S, divinylbenzene, divinylbiphenyl, 1,3-diisopropenylbenzene, 1,4-diisopropenylbenzene, 1,3-bis (allyloxy) adamantane, 1,3-bis (vinyloxy) adamantane, 1,3,5-tris (allyloxy) adamantane, 1,3,5-tris (vinyloxy) adamantane, dicyclopentadiene, vinylcyclohexene, 1,5-hexadiene, 1,9-decadiene, diallyl ether, bisphenol A diallyl ether, 2,5-diallylphenol allyl ether, and oligomers of these compounds, 1,2-polybutadiene (having an 1,2 ratio of 10-100%, preferably having a 1,2 ratio of 50-100%), allyl ether of novolac phenol, allylated polyphenylene oxide, and, additionally, compounds obtained by substituting all glycidyl groups of a conventionally known epoxy resin with allyl groups, and the like.

From a point of view of heat resistance and light resistance, the compound (δ) preferably is a compound represented by the following general formula (VI).

[Chemical Formula 7]

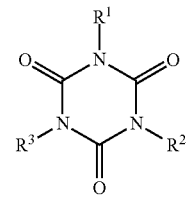

(VI)

$R^1$ and $R^2$ in the formula are each an alkenyl group and may be the same or different. $R^3$ represents a monovalent organic group having 1-50 carbon atoms.

$R^1$ and $R^2$ are preferably the same as the above-described alkenyl groups in the compound (α), and among the alkenyl groups, a vinyl group and an allyl group are preferable, and an allyl group is particularly preferable. From a point of view of increasing heat resistance of a cured product, the number of carbon atoms of $R^3$ is preferably 1-20, and more preferably 1-10. Specific examples of $R^3$ are the same as the above-described specific examples of $R^{10}$-$R^{17}$ in the general formula (IV). $R^3$ may contain a carbon-carbon double bond reactive with a SiH group. Preferred examples of the compound (δ) include triallyl isocyanurate and diallyl monomethyl isocyanurate.

$R^3$ in the general formula (VI) may be a reactive group such as a glycidyl group. Since a glycidyl group which is a kind of epoxy group is cationic polymerizable, a compound for which $R^3$ in the general formula (VI) is a glycidyl group is classified as the above-described compound (γ). On the other hand, when a compound containing a functional group having a higher cationic polymerizability than a glycidyl group is used as the compound (γ) (for example, a compound containing an alicyclic epoxy group such as vinyl cyclohexene oxide), since the alicyclic epoxy group is mainly involved in cationic polymerization, contribution of the glycidyl group to cationic polymerization is small. Therefore, a compound for which $R^3$ in the general formula (VI) is a glycidyl group can be classified as the compound (δ). A specific example of such a compound (δ) is diallyl monoglycidyl isocyanurate.

As a starting substance in the synthesis of the compound (A) by a hydrosilylation reaction, a compound (ε): a compound having only one functional group involved in a hydrosilylation reaction in one molecule (however, except for the compound (α) and the compound (γ)) may be used. The functional group involved in a hydrosilylation reaction is a SiH group or an alkenyl group. By using a compound containing only one functional group involved in a hydrosilylation reaction, a specific functional group can be introduced to a terminal of the compound (A).

For example, by using a siloxane compound having one SiH group as the compound (ε), a siloxane structural site can be introduced to a terminal of the compound (A). Specific examples of the siloxane compound having one SiH group include a cyclic polysiloxane compound for which m=1 in the above-described general formula (III), a polyhedral polysiloxane compound for which one of $R^{10}$-$R^{17}$ in the above-described general formula (IV) is a hydrogen atom, a silylated silicic acid compound for which one of $R^{18}$-$R^{41}$ in the above-described general formula (V) is a hydrogen atom, and the like. The siloxane compound having one SiH group may be a chain siloxane compound.

By using a compound having one group containing one alkenyl group as the compound (ε), a desired functional group can be introduced to a terminal of the compound (A).

In addition to the above, a compound involved in a hydrosilylation reaction, such as a chain polysiloxane having two or more SiH groups, may be included in the starting substances.

In the above example, by using the compound (α) having an alkenyl group and an alkali-soluble functional group and a compound having an alkenyl group and a cationically polymerizable functional group, an alkali-soluble group and a cationically polymerizable functional group are introduced into the cyclic polysiloxane compound (β) having multiple SiH groups. Instead of the compound (α), a compound containing an alkali-soluble functional group and a SiH group may be used, and, instead of the compound (γ), a compound containing a cationically polymerizable functional group and a SiH group may be used. In this case, by using a cyclic polysiloxane compound having an alkenyl group, a cationically polymerizable functional group and/or an alkali-soluble functional group can be introduced into a cyclic polysiloxane compound. As a cyclic polysiloxane compound, a compound having multiple alkenyl groups may be used.

Examples of a cyclic siloxane compound containing an alkenyl group include 1,3,5,7-tetravinyl-1,3,5,7-tetramethylcyclotetrasiloxane, 1-propyl-3,5,7-trivinyl-1,3,5,7-tetramethylcyclotetrasiloxane, 1,5-divinyl-3,7-dihexyl-1,3,5,7-tetramethylcyclotetrasiloxane, 1,3,5-trivinyl-1,3,5-trimethylcyclosiloxane, 1,3,5,7,9-pentavinyl-1,3,5,7,9-pentamethylcyclosiloxane, 1,3,5,7,9,11-hexavinyl-1,3,5,7,9,11-hexamethylcyclosiloxane, and the like. In a cyclic polysiloxane compound having an alkenyl group, from a point of view of heat resistance and light resistance, an organic group present on a Si atom is preferably a vinyl group or a methyl group.

Hydrosilylation Reaction

A sequential order and a method of a hydrosilylation reaction are not particularly limited. For example, the compound (A) is obtained by a hydrosilylation reaction according to a method described in International Publication No. 2009/075233. From a point of view of simplifying a synthesis process, a method is preferable in which all starting substances are charged into one pot to perform a hydrosilylation reaction and finally unreacted compounds are removed. On the other hand, from a point of view of suppressing generation of a low molecular weight substance, it is preferable to stepwise perform introduction of an alkali-soluble functional group and introduction of a cationically polymerizable functional group into a cyclic polysiloxane compound. For example, a method is preferable in which a compound (for example, the compound (α) and/or the compound (δ)) containing multiple alkenyl groups and a compound (for example, the compound (β)) containing multiple SiH groups are subjected to a hydrosilylation reaction with one of the two compounds in an excess amount, and, after removing an unreacted compound, a compound (for example, the compound (γ) and/or the compound (ε)) having only one functional group involved in a hydrosilylation reaction in one molecule is added to perform a hydrosilylation reaction.

Ratios of the compounds in the hydrosilylation reactions are not particularly limited. However, a total amount A of the alkenyl groups and a total amount B of the SiH groups of the starting substances preferably satisfy 1≤B/A≤30, and more preferably satisfy 1≤B/A≤10. When B/A is 1 or larger, unreacted alkenyl groups are unlikely to remain, and when B/A is 30 or less, unreacted SiH groups are unlikely to remain, and thus, characteristics of a cured film can be improved.

In a hydrosilylation reaction, a hydrosilylation catalyst such as a chloroplatinic acid, a platinum-olefin complex, or a platinum-vinylsiloxane complex may be used. A hydrosilylation catalyst and a promoter may be used in combination. An additive amount of a hydrosilylation catalyst is not particularly limited, but is preferably $10^{-8}$-$10^{-1}$ times, and more preferably $10^{-6}$-$10^{-2}$ times a total amount (number of moles) of alkenyl groups contained in the starting substances.

A hydrosilylation reaction temperature may be appropriately set, and is preferably 30-200° C., and more preferably 50-150° C. An oxygen volume concentration of a gas phase part in a hydrosilylation reaction is preferably 3% or less. From a point of view of promoting the hydrosilylation reaction by adding oxygen, the gas phase part may contain about 0.1-3 vol % of oxygen.

In a hydrosilylation reaction, a solvent may be used. Examples of the solvent include hydrocarbon-based solvents such as benzene, toluene, hexane and heptane; ether-based solvents such as tetrahydrofuran, 1,4-dioxane, 1,3-dioxolane and diethyl ether; ketone-based solvents such as acetone and methyl ethyl ketone; halogen-based solvents such as chloroform, methylene chloride and 1,2-dichloroethane; and the like. Since distillation after a reaction is easy, toluene, tetrahydrofuran, 1,4-dioxane, 1,3-dioxolane or chloroform is preferable. In a hydrosilylation reaction, when necessary, a gelation inhibitor may be used.

Preferred Embodiments of Compound (A)

The compound (A) preferably has an alicyclic epoxy group as a cationically polymerizable functional group. The compound (A) preferably has a glycidyl group in addition to an alicyclic epoxy group as a cationically polymerizable functional group. When the compound (A) has a glycidyl group, dispersibility of a coloring agent to the compound (A) improves, and an uncured coating film is more likely to be uniformly dissolved in an alkali developer. An alicyclic epoxy group is preferably introduced into the compound (A) using the compound (γ) having a vinyl group and an alicyclic epoxy group in one molecule as a starting substance. A glycidyl group is preferably introduced into the compound (A) using an isocyanuric acid derivative represented by the general formula (VI) (where $R^3$ is a glycidyl group) as a starting substance.

The compound (A) preferably has an alkali-soluble group. Among alkali-soluble groups, the above-described structure X1 or structure X2 is preferable. As described above, the structures X1 and X2 can be respectively introduced into the compound (A) using a diallyl isocyanuric acid and a monoallyl isocyanuric acid as starting substances (the compound (α)).

A cyclic structure of a cyclic polysiloxane is preferably introduced into the compound (A) using a cyclic polysiloxane having two or more SiH groups as a starting substance (the compound (β)). Among these, as the compound (β), 1,3,5,7-tetrahydrogen-1,3,5,7-tetramethylcyclotetrasiloxane is preferably used.

(B) Photoacid Generator

The photosensitive composition contains a photoacid generator (cationic polymerization initiator). The photoacid generator is a compound that generates an acidic active substance by irradiation of active energy ray. The cationically polymerizable functional group reacts with an acid generated from the photoacid generator, and the resin composition is photocured.

As the photoacid generator, commonly known photoacid generators such as sulfonate esters, carboxylic acid esters and onium salts can be applied, and onium salts are particularly preferable.

Examples of onium salts include tetrafluoroborate ($BF_4^-$), hexafluorophosphate ($PF_6^-$), hexafluoroantimonate ($SbF_6^-$), hexafluoroarsenate ($AsF_6^-$), hexachloroantimonate ($SbCl_6^-$), tetraphenyl borate, tetrakis (trifluoromethylphenyl) borate, tetrakis (pentafluoromethylphenyl) borate, fluoroalkyl fluorophosphate, perchloric acid ion ($ClO_4^-$), trifluoromethanesulfonic acid ion ($CF_3SO_3^-$), fluorosulfonic acid ion ($FSO_3^-$), toluenesulfonic acid ion, sulfonium salts having anions such as trinitrobenzene sulfonic acid anion and trinitrotoluene sulfonic acid anion, and iodonium salts. The photoacid generator is preferably an iodonium salt, and particularly preferably an aromatic iodonium salt.

When anions in the photoacid generator are arranged in a descending order of acid strength, the anions are arranged as $SbF_6^-$, $B(C_6F_5)_4^-$, $PF_6^-$, $CF_3SO_3^-$, and $HSO_4^-$. When the acid strength of the anions of the photoacid generator is greater, a residual film rate tends to become higher. A pKa of an acid generated from the photoacid generator is preferably less than 3, and more preferably less than 1.

A content of the photoacid generator in the photosensitive composition is not particularly limited. From a point of view of a cure rate and a balance of physical properties of a cured product, the content of the photoacid generator with respect to 100 parts by weight of the compound (A) is preferably 0.1-20 parts by weight, and more preferably 1-15 parts by weight.

(C) Coloring Agent

The photosensitive composition of the present invention contains a coloring agent. By containing the coloring agent, a colored cured film is obtained. Examples of the coloring agent include organic pigments, inorganic pigments, dyes, and the like. From a point of view of heat resistance and colorability, a pigment is preferably used as the coloring agent. When a black colored pattern such as a black matrix of a color filter or a partition wall between pixels of a display is formed using the photosensitive composition, a black pigment is preferably used as the coloring agent.

Examples of a black organic pigment that broadly absorbs wavelengths in a visible light range include anthraquinone-based black pigments, perylene-based black pigments, azo-based black pigments, lactam-based black pigments, and the like. Among these black pigments, since a light shielding property can be efficiently improved, perylene-based black pigments and lactam-based black pigments are preferable. A mixed color organic pigment may be used in which two or more chromatic color pigments are blended so that a resulting mixture becomes black, that is, so that light of wavelengths in a visible light range is broadly absorbed. In order to efficiently reduce light transmittance, the mixed color organic pigment preferably contains a blue pigment and/or a violet pigment.

Examples of inorganic pigments include composite metal oxide pigments, carbon black, black low-order titanium oxynitride, titanium oxide, barium sulfate, zinc white, lead sulfate, yellow lead, red iron oxide, ultramarine, prussian blue, chromium oxide, antimony white, iron black, red lead, zinc sulfide, cadmium yellow, cadmium red, zinc, manganese purple, cobalt purple, barium sulfate, metal oxides such as magnesium carbonate, metal sulfide, sulfate, metal hydroxide, metal carbonate, and the like. Examples of dyes include azo-based, anthraquinone-based, perylene-based, perinone-based, phthalocyanine-based, carbonium-based, and indigoid-based compounds.

In order to obtain a colored film, a content ratio of the coloring agent in a total solid content of the photosensitive composition is preferably 5% by weight or more. In the present invention, by using the above-described compound (A) as a binder resin component of the photosensitive composition, even when the content of the coloring agent is increased, the coloring agent has sufficient dispersibility. Therefore, the photosensitive composition of the present invention is excellent in coating film formability and in patternability by alkali development.

The content ratio of the coloring agent may be adjusted according to a type of the coloring agent, a color or a light shielding property of a colored film, or the like. The content of the coloring agent with respect to the total solid content of the photosensitive composition is preferably 7-70% by weight, more preferably 10-60% by weight, and even more preferably 12-50% by weight. When the content of the coloring agent is small, the light shielding property may be insufficient. When the content of the coloring agent is excessively large, the dispersibility of the coloring agent may decrease, and the coating film formability or the patternability by alkali development may decrease. From a point of view of achieving both the dispersibility of the coloring agent and the light shielding property and enhancing the heat resistance of the cured film, the content of the coloring agent in the photosensitive composition with respect to 100 parts by weight of the compound (A) is preferably 8-120 parts by weight, more preferably 10-100 parts by weight, and even more preferably 15-80 parts by weight.

Since the photosensitive composition of the present invention contains a photosensitive polysiloxane compound having high heat resistance, a cured film excellent in heat resistance can be formed. In order to further increase the heat resistance of the cured film, an inorganic pigment is preferably used as the coloring agent. An inorganic pigment is excellent in heat resistance, and is less susceptible to decomposition by heating. In order to obtain a cured film having further improved heat resistance, a ratio of an inorganic pigment in the coloring agent is preferably 60% by weight or more, more preferably 70% by weight or more, and even more preferably 75% by weight or more.

In general, when the content of the coloring agent is high, there is a tendency that a dielectric constant of a colored film or a colored pattern increases and insulation performance deteriorates. Since the cyclic polysiloxane-based compound (A) has a lower dielectric constant as compared to an acrylic material and is excellent in the dispersibility of the coloring agent, even when the content of the coloring agent in the composition is high, a colored films and a colored pattern excellent in insulation performance can be formed. Since an organic pigment has a small dielectric constant and is unlikely to cause deterioration in the insulation performance, in order to obtain a cured film having further improved insulation performance, an organic pigment is preferably used as the coloring agent. In order to obtain a cured film having high insulation performance and excellent in electrical reliability, a ratio of an organic pigment in the coloring agent is preferably 60% by weight or more, more preferably 70% by weight or more, and even more preferably 75% by weight or more.

(D) Reactive Diluent

The photosensitive composition of the present invention may contain a reactive diluent. By blending a reactive diluent into the composition, reduction in curing shrinkage of a resulting cured film and control of a mechanical strength of the cured film are possible. Further, by blending the reactive diluent, since reaction points (crosslinking points) of photo cationic polymerization are increased, a cure rate during exposure can be increased and an exposure time can be shortened. In particularly, since the photosensitive composition used in forming a colored film or a colored pattern has a large content of the coloring agent (C), a density of crosslinking points tends to become small as compared to a photosensitive composition for forming transparent film. Therefore, an effect of improving a photocuring rate by blending a reactive diluent is prominent.

As a reactive diluent of photo cationic polymerization, a compound having two or more cationically polymerizable functional groups in one molecule is used. Examples of the cationically polymerizable functional groups of the reactive diluent (D) include those described above as examples of the cationically polymerizable functional group of the compound (A). The cationically polymerizable functional groups of the reactive diluent (D) may be the same as or different from the cationically polymerizable functional group of the compound (A). Since cationic polymerization reactivity is high, the reactive diluent (D) preferably has an alicyclic epoxy group as a cationically polymerizable functional group. In a particularly preferred embodiment, the compound (A) contains an alicyclic epoxy group as a cationically polymerizable functional group and the reactive diluent (D) has two or more alicyclic epoxy groups in one molecule.

Examples of a compound having two or more alicyclic epoxy groups in one molecule include 3,4-epoxycyclohexylmethyl-3',4'-epoxycyclohexane carboxylate ("Celoxide 2021P" manufactured by Daicel), ε-caprolactone modified 3',4'-epoxycyclohexylmethyl 3,4-epoxycyclohexane carboxylate ("Celoxide 2081" manufactured by Daicel), bis(3,4-epoxycyclohexylmethyl)adipate, an epoxy-modified chain siloxane compound of the following formula S1 ("X-40-2669" manufactured by Shin-Etsu Chemical Co., Ltd.), an epoxy-modified cyclic siloxane compound of the following formula S2 ("KR-470" manufactured by Shin-Etsu Chemical Co., Ltd.), and the like.

[Chemical Formula 8]

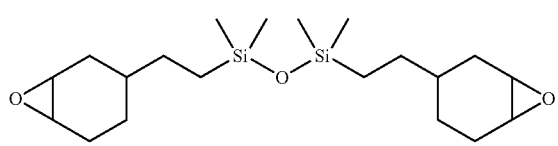

S1

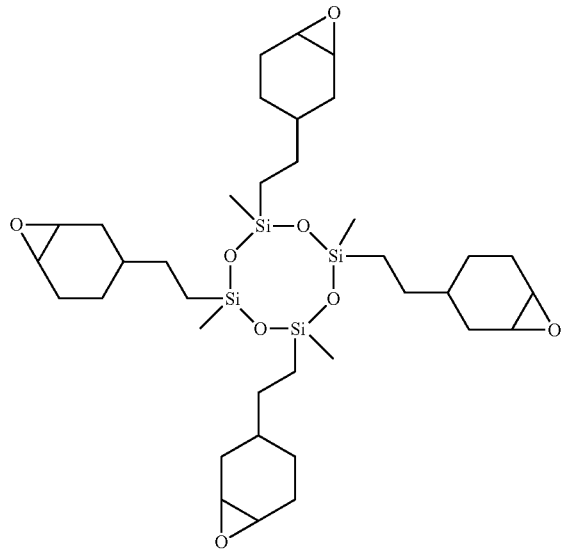

S2

Among these compounds, when a compound having three or more alicyclic epoxy groups in one molecule is blended as a reactive diluent, the effect of improving the cure rate tends to be prominent. Further, a reactive diluent, such as the compound of the above formula S2, having a cyclic polysiloxane skeleton allows high heat resistance and a low dielectric property of the compound (A) to be maintained even when a content of the reactive diluent in the composition is increased, and thus is preferable.

The content of the reactive diluent in the photosensitive composition is not particularly limited. However, from a point of view of achieving both an improvement in the cure rate of the photosensitive composition and a balance of physical properties of a cured product, the content of the reactive diluent with respect to the total solid content of the photosensitive composition is preferably 5-75% by weight, more preferably 8-60% by weight, and even more preferably 10-50% by weight. The content of the reactive diluent with respect to 100 parts by weight of the compound (A) is preferably 10-150 parts by weight, more preferably 15-100 parts by weight, and even more preferably 20-70 parts by weight.

(E) Sensitizer

The photosensitive composition of the present invention may contain a sensitizer. By using a sensitizer, exposure sensitivity during patterning improves. As a sensitizer, an anthracene-based sensitizer is preferable. Specific examples of an anthracene-based compound include anthracene, 2-ethyl-9,10-dimethoxyanthracene, 9,10-dimethylanthracene, 9,10-dibutoxyanthracene (DBA), 9,10-dipropoxyanthracene, 9,10-diethoxyanthracene, 1,4-dimethoxyanthracene, 9-methylanthracene, 2-ethylanthracene, 2-tert-butylanthracene, 2,6-di-tert-butylanthracene, 9,10-diphenyl-2,6-di-tert-butylanthracene, and the like. Among these compounds, from a point of view of compatibility with the photosensitive composition, 9,10-dibutoxyanthracene, 9,10-dipropoxyanthracene, 9,10-diethoxyanthracene and the like are preferable.

A content of a sensitizer in the photosensitive composition is not particularly limited. However, from a point of view of curability and a balance of physical properties of a cured product, the content of the sensitizer with respect to 100 parts by weight of the compound (A) is preferably 0.01-20 parts by weight, and more preferably 0.1-15 parts by weight. When the amount of the sensitizer is small, a sensitivity improving effect may not be sufficiently obtained. When the amount of the sensitizer is large, an increase in an out gas generated from a thin film and a decrease in light resistance may be caused to occur.

Solvent

The photosensitive composition is obtained by dissolving or dispersing the above-described components (A)-(C), and the components (D) and (E) when necessary, in a solvent. The components of the photosensitive composition may be mixed and prepared immediately before film formation, or all the components may be stored in a state of one situation mixed and prepared in advance.

The solvent may be any solvent capable of dissolving the compound (A). Specifically, examples of the solvent include hydrocarbon-based solvents such as benzene, toluene, hexane and heptane; ether-based solvents such as tetrahydrofuran, 1,4-dioxane, 1,3-dioxolane and diethyl ether; ketone-based solvents such as acetone, methyl ethyl ketone, methyl isobutyl ketone and cyclohexanone; glycol-based solvents such as propylene glycol-1-monomethyl ether-2-acetate (PGMEA), diethylene glycol dimethyl ether, diethylene glycol ethyl methyl ether and ethylene glycol diethyl ether; halogen-based solvents such as chloroform, methylene chloride and 1,2-dichloroethane; and the like. From a point of view of film forming stability, propylene glycol-1-monomethyl ether-2-acetate and diethylene glycol dimethyl ether are preferable.

An amount of a solvent to be used can be appropriately set. A preferred amount of a solvent to be used with respect to 1 g of the solid content of the photosensitive composition is 0.1-10 mL. When the amount of the solvent to be used is small, an effect of using a solvent having a low viscosity or the like may be unlikely to be obtained. When the amount of the solvent to be used is large, film formation uniformity may be deteriorated.

Other Components

The photosensitive composition of the present invention may contain a resin component or an additive or the like other than the above-described components (A)-(E).

Polymer Dispersant

In order to improve the dispersibility of the coloring agent in the composition, a polymer dispersant may be used. From a point of view of affinity to the coloring agent, the polymer dispersant is preferably a compound having an acidic functional group. Examples of the acidic functional group include a carboxyl group, a sulfo group, and a phosphoric acid group, and a carboxyl group is preferable. An acid value of the polymer dispersant is preferably 10-100 mgKOH/g. Examples of the polymer dispersant include urethane-based, polyimide-based, alkyd-based, epoxy-based, unsaturated polyester-based, melamine-based, phenol-based, acryl-based, vinyl chloride-based, vinyl chloride-vinyl acetate copolymer-based, polyamide-based, and polycarbonate-based compounds, and the like. Among these compounds, acrylic-based and polyester-based compounds are particularly preferable. An amount of a polymer dispersant to be used with respect to 100 parts by weight of the coloring agent is preferably 5-80 parts by weight, and particularly preferably 10-65 parts by weight.

Thermoplastic Resin

For a purpose of modifying characteristics of the photosensitive composition, various thermoplastic resins can also be added to the photosensitive composition. Examples of thermoplastic resins include acrylic resins, polycarbonate-based resins, cycloolefin-based resins, olefin-maleimide-based resins, polyester-based resins, a polyether sulfone resin, a polyarylate resin, a polyvinyl acetal resin, a polyethylene resin, a polypropylene resin, a polystyrene resin, a polyamide resin, a silicone resin, a fluorine resin, and rubber-like resins such as a natural rubber and EPDM. The thermoplastic resin may have a crosslinking group such as epoxy group, an amino group, a radically polymerizable unsaturated group, a carboxyl group, an isocyanate group, a hydroxyl group and an alkoxysilyl group.

Filler

The photosensitive composition may contain a filler when necessary. Examples of the filler include silica-based fillers (such as quartz, fumed silica, precipitated silica, silicic anhydride, fused silica, crystalline silica and ultrafine amorphous silica), silicon nitride, silver powder, alumina, aluminum hydroxide, titanium oxide, glass fiber, carbon fiber, mica, carbon black, graphite, diatomaceous earth, white clay, clay, talc, calcium carbonate, magnesium carbonate, barium sulfate, inorganic balloon, and the like.

Additives

In addition to the above, the photosensitive composition may also contain an adhesion improver, a coupling agent (such as a silane coupling agent), a deterioration inhibitor, a radical inhibitor, a release agent, a flame retardant, a flame retardant aid, a surfactant, an antifoaming agent, an emulsifier, a leveling agent, a cissing inhibitor, an ion trapping agent (such as antimony-bismuth), a thixotropic agent, a tackifier, a storage stability improver, an ozone deterioration inhibitor, a light stabilizer, a thickening agent, a plasticizer, a reactive diluent, an antioxidant, a heat stabilizer, a conductivity imparting agent, an antistatic agent, a radiation blocking agent, a nucleating agent, a phosphorus-based peroxide decomposing agent, a lubricant, a pigment, a metal deactivator, a thermal conductivity imparting agent, a physical property adjusting agent, and the like within ranges such that the purpose and effect of the present invention are not impaired.

Film Formation and Formation of Colored Pattern

Since the above-described photosensitive composition contains the compound (A) having a cationically polymerizable functional group and contains the photoacid generator, a colored cured film can be formed by coating, pre-baking (dry removal of the solvent) and exposure. The cured film is excellent in a light shielding property and heat resistance. When the compound (A) has an alkali-soluble functional group, the above-described photosensitive composition can be applied as a negative type photosensitive composition. The negative type photosensitive composition allows patterning to be performed by coating, pre-baking, exposure and an alkali development process, and thereafter, allows a colored pattern to be formed by post-baking.

A method for applying the photosensitive composition on various substrates is not particularly limited as long as the method allows uniform coating to be performed, and general coating methods such as spin coating and slit coating can be used. Before exposure, heating (pre-baking) for a purpose of drying the solvent may be performed. A heating temperature can be appropriately set, but is preferably 60-200° C., and more preferably 80-150° C. Further, before exposure, vacuum devolatilization may be performed. The vacuum devolatilization may be simultaneously performed with the heating.

A light source for exposure may be selected according to absorption wavelengths of the photoacid generator and the sensitizer contained in the photosensitive composition. Usually, a light source including wavelengths in a range of 200-450 nm (for example, a high pressure mercury lamp, an extra-high pressure mercury lamp, a metal halide lamp, a high power metal halide lamp, a xenon lamp, a carbon arc lamp, a light emitting diode, or the like) is used.

An exposure amount is not particularly limited, but is preferably 1-8000 mJ/cm$^2$, and more preferably 3-3000 mJ/cm$^2$. When an exposure amount is too small, curing may be insufficient and pattern formability may deteriorate, and, when the exposure amount is too large, a manufacturing cost may increase due to an increase in a takt time. For a purpose of promoting a photoreaction, after exposure and before development, post exposure bake (PEB) may be performed by applying heat. Since the photosensitive composition of the present invention is excellent in photosensitivity, a pattern can be formed without performing PEB, and the photosensitive composition is excellent in processability.

A method for developing a coating film after exposure is not particularly limited. For example, a desired pattern can be formed by bringing an alkali solution into contact with a coating film using an immersion method or a spray method or the like and by dissolving and removing an unexposed portion. As an alkali developer, those commonly used can be used without particular limitation. Specific examples of the alkali developer include organic alkali aqueous solutions such as a tetramethylammonium hydroxide (TMAH) aqueous solution and a choline aqueous solution, inorganic alkali aqueous solutions such as a potassium hydroxide aqueous solution, a sodium hydroxide aqueous solution, a potassium carbonate aqueous solution, a sodium carbonate aqueous solution and a lithium carbonate aqueous solution, and the like. From a point of view of increasing contrast between an exposed portion and an unexposed portion, an alkali concentration is preferably 25% by weight or less, more preferably 10% by weight or less, and even more preferably 5% by weight or less. For a purpose of adjusting a dissolution rate or the like, a developer may contain an alcohol, a surfactant, and the like.

A post-baking condition after alkali development can be appropriately set. A post-baking temperature is preferably 100-400° C., and more preferably 120-350° C.

A thin film formed by the photosensitive composition of the present invention has a light shielding property and is excellent in heat resistance. As the light shielding property, light transmittance of a thin film can be used as an indicator. When a film thickness of a thin film is 2 μm, the light transmittance at 550 nm is preferably 25.1% or less (optical density (OD) is 0.6 or more), more preferably 10% or less (OD is 1 or more), and even more preferably 3.2% or less (OD is 1.5 or more). As described above, the photosensitive composition of the present invention is excellent in the dispersibility of the coloring agent to a resin component, and thus, is excellent in film formability and patternability even when a large amount of the coloring agent is contained so as to have the above-described light shielding property. Therefore, a colored pattern having high pattern precision and a high light shielding property can be formed. Such a colored pattern can be applied to a black matrix, a partition wall, or the like of a display element.

In applications such as a black matrix, a partition wall or the like of a display element, from a point of view of improving electrical reliability, it may be required that a pattern material have a low dielectric constant. The photosensitive composition of the present invention uses a cyclic siloxane-based compound as a binder component, and thus, can have a low dielectric constant. A relative permittivity of a cured product applied to such applications is preferably 4.0 or less, more preferably 3.8 or less, and even more preferably 3.5 or less.

EXAMPLES

In the following, the present invention is described in detail based on examples. However, the present invention is not limited to the following examples.

Synthesis Example 1

144.8 g of toluene and 32.4 g of 1,3,5,7-tetrahydrogen-1,3,5,7-tetramethylcyclotetrasiloxane (hereinafter referred to as "TMCTS") were charged into a 500 mL four-necked flask, and a gas phase part was replaced with nitrogen, and thereafter, an internal temperature was set to 105° C., and a mixed solution of 13.1 g of diallyl monoglycidyl isocyanurate, 20.7 g of a monoallyl isocyanuric acid, 70 g of dioxane and 0.0306 g of a xylene solution of a platinum vinylsiloxane complex (containing 3% by weight as platinum) was added dropwise.

After confirming disappearance of allyl groups using 1H-NMR, a mixed solution of 42.3 g of toluene and 22.3 g of vinylcyclohexene oxide was added dropwise. Disappearance of vinyl groups was confirmed using 1H-NMR, and the reaction was terminated by cooling. Toluene was distilled off under a reduced pressure, and a polysiloxane-based compound 1 (polymer) was obtained. Based on a 1H-NMR measurement, the polysiloxane-based compound 1 was shown to have 2.4 mmol/g of alicyclic epoxy groups.

Synthesis Example 2

144.8 g of toluene and 32.4 g of TMCTS were charged into a 500 mL four-necked flask, and a gas phase part was replaced with nitrogen, and thereafter, an internal temperature was set to 105° C., and a mixed solution of 13.1 g of diallyl monomethyl isocyanurate, 25.7 g of a diallyl isocyanuric acid, 70 g of dioxane and 0.0306 g of a xylene solution of a platinum vinylsiloxane complex (containing 3% by weight as platinum) was added dropwise. After confirming disappearance of allyl groups, a mixed solution of 42.3 g of toluene and 22.3 g of vinylcyclohexene oxide was added dropwise, and thereafter, in the same manner as in Example 1 described above, a polysiloxane-based compound 2 (a cyclic polysiloxane-based polymer having 2.3 mmol/g of epoxy groups) was obtained.

Synthesis Example 3

144.8 g of toluene and 32.4 g of 1,1,3,3-tetramethyldisiloxane were charged into a 500 mL four-necked flask, and a gas phase part was replaced with nitrogen, and thereafter, a mixed solution of 20.0 g of octa (vinyldimethylsiloxy) octasilsesquioxane which is a polyhedral structured polysiloxane, 12.7 g of a diallyl isocyanuric acid, 70 g of dioxane and 0.0306 g of a xylene solution of a platinum vinylsiloxane complex (containing 3% by weight as platinum) was added dropwise. After confirming disappearance of allyl groups, a mixed solution of 22.3 g of toluene and 22.3 g of vinylcyclohexene oxide was added dropwise, and thereafter, in the same manner as in Example 1 described above, a polysiloxane-based compound 3 (a cyclic polysiloxane-based polymer having 2.2 mmol/g of epoxy groups) was obtained.

Synthesis Example 4

10 g of toluene and 10 g of chain trimethylsilyl-terminated polymethylhydrosiloxane (HMS-991) were charged into a 200 mL four-necked flask, and a gas phase part was replaced with nitrogen, and thereafter, an internal temperature was set to 105° C., and a mixed solution of 2.5 g of diallyl monomethyl isocyanurate, 5 g of a diallyl isocyanuric acid, 30 g of dioxane and 0.003 g of a xylene solution of a platinum vinylsiloxane complex (containing 3% by weight as platinum) was added dropwise. After confirming disappearance of allyl groups, a mixed solution of 7.5 g of toluene and 7.5 g of vinylcyclohexene oxide was added dropwise, and thereafter, in the same manner as in Example 1 described above, a polysiloxane-based compound 4 (a chain polysiloxane-based polymer having 2.4 mmol/g of epoxy groups) was obtained.

Raw materials of Synthesis Examples 1-4 (compounds 1-4) are listed in Table 1. In Table 1, a compound having multiple alkenyl groups in one molecule is underlined.

Pigment Dispersion Preparation Example 1 except that carbon black ("MA100" manufactured by Mitsubishi Chemical Corporation) was used as a pigment.

Pigment Dispersion Preparation Example 4

A pigment dispersion D having a pigment concentration of 20% by weight was obtained in the same manner as in Pigment Dispersion Preparation Example 1 except that titanium black ("UF-8" manufactured by Mitsubishi Materials Corporation) was used as a pigment.

Examples 1-7, Comparative Examples 1-3, and Reference Examples 1 and 2

Preparation of Photosensitive Composition

The component (A): As an alkali-soluble resin having a cationically polymerizable functional group, the compounds 1-4 obtained in the above-described synthesis examples, or a radical curable acrylic resin having an acryloyl group and a carboxyl group ("Cyclomer P (ACA) Z251" manufactured by Daicel Ornex) was used. In a solvent (PGMEA), the above-described components (A), the component (B): a photoacid generator ("Ik-1" manufactured by San Apro), the component (C): pigment dispersions 1-4, the component (D): alicyclic epoxy-modified cyclic polysiloxane ("KR-470" manufactured by Shin-Etsu Chemical Co., Ltd.) or tris(2-acryloyloxyethyl)isocyanate ("Funkryl FA-731A" manufactured by Hitachi Chemical Co., Ltd.), the component (E): dibutoxyanthracene (DBA manufactured by Kawasaki Kasei Kogyo Co., Ltd.) as a sensitizer, and the solvent

TABLE 1

|  | (α) Alkali-soluble group | (β) Cyclic polysiloxane | (γ) Cationically polymerizable group | Chain polysiloxane | (δ) Others |
|---|---|---|---|---|---|
| Compound 1 | Monoallyl isocyanuric acid | TMCTS | Vinyl cyclohexene oxide | — | Diallyl monoglycidyl isocyanurate |
| Compound 2 | Diallyl isocyanuric acid | TMCTS | Vinyl cyclohexene oxide | — | Diallyl monomethyl isocyanurate |
| Compound 3 | Diallyl isocyanuric acid | Polyhedral structured polysiloxane | Vinyl cyclohexene oxide | 1,1,3,3-tetramethyldisiloxane | — |
| Compound 4 | Diallyl isocyanuric acid | — | Vinyl cyclohexene oxide | HMS-991 | Diallyl monomethyl isocyanurate |

Pigment Dispersion Preparation Example 1

10 g of perylene black ("Lumogen Black FK4281" manufactured by BASF) as a pigment and 4 g of a polymer dispersant ("Ajisper PN411" manufactured by Ajinomoto Fine-Techno Co., Ltd.) were added to 36 g of PGMEA and the mixture was stirred for 3 hours with a homogenizer, and a pigment dispersion A having a pigment concentration of 20% by weight was obtained.

Pigment Dispersion Preparation Example 2

A pigment dispersion B having a pigment concentration of 20% by weight was obtained in the same manner as in Pigment Dispersion Preparation Example 1 except that lactam black ("Irgaphor Black S 0100 CF" manufactured by BASF) was used as a pigment.

Pigment Dispersion Preparation Example 3

A pigment dispersion C having a pigment concentration of 20% by weight was obtained in the same manner as in (PGMEA) were blended at proportions (parts by weight) shown in Table 2, and a photosensitive composition was prepared.

Evaluation

Film Formability

The compositions of Examples 1-6, Comparative Examples 1-3 and Reference Examples 1 and 2 were each coated on a 50×50 mm alkali-free glass substrate by spin coating so as to have a film thickness of 2.0 μm after post-baking, and were each pre-baked for 2 minutes at 100° C. on a hot plate. Uniformity of a thin film after pre-baking was visually evaluated.

A: Unevenness and cissing did not occur, and a uniform film was formed.

X: Unevenness and cissing occurred, and a uniform film could not be formed.

Photosensitivity

The thin film obtained above was exposed through a photomask (line/space=20 μm/20 μm) using a mask aligner (MA-1300, manufactured by Japan Science Engineering Co., Ltd.), and thereafter, the film was immersed in an alkali developer (TMAH 2.38% aqueous solution, manufactured by Tama Chemical Industries Co., Ltd.) at 23° C. for 70 seconds and a development process was performed. Further, post-baking was performed in an oven at 230° C. for 30 minutes, and a cured film was formed. An integrated exposure amount was varied in increments of 20 mJ/cm$^2$, and for each cured film, a line and space part was observed using a laser microscope (OLS4000 manufactured by Olympus Corporation) and a cross-sectional profile was measured. A minimum exposure amount at which a line width was 20±0.5 μm was evaluated. A smaller value of the exposure amount means a better sensitivity, and patterning by exposure for a short time is possible.

Alkali Developability

Alkali developability was evaluated by visually observing a behavior of a film of an unexposed portion being removed from a substrate when a sample after being exposed at an exposure amount at which a line width was 20±0.5 μm was subjected to alkali development.

A: The film of the unexposed portion was uniformly dissolved in a developer (see FIG. 1A).
B: The film of the unexposed portion was removed so as to peel off from the substrate, and an undissolved solid matter in the developer was confirmed (see FIG. 1B).
X: The film of the unexposed portion did not dissolve.

Light Shielding Property

Coating was performed by spin coating such that a film thickness after post-baking was 2.0 μm. Pre-baking was performed on a hot plate at 100° C. for 2 minutes. Without performing exposure and development, post-baking was performed in an oven at 230° C. for 30 minutes, and a cured film was formed. An optical density (OD) of the cured film was measured using a transmission densitometer X-rite 361T (manufactured by X-rite).

Heat Resistance

The cured film after post-baking was heated in an oven at 240° C. for 1 hour, and heat resistance was evaluated based on a change in film thickness before and after heating.

A: A reduction in film thickness was less than 0.05 μm.
X: A reduction in film thickness was 0.05 μm or more.

The compositions and the evaluation results of the photosensitive compositions of the examples, the comparative examples and the reference examples are shown in Table 2.

TABLE 2

| | | | Example 1 | Example 2 | Example 3 | Example 4 | Example 5 | Example 6 | Example 7 |
|---|---|---|---|---|---|---|---|---|---|
| Composition | (A) | Compound 1 | 100 | 100 | 100 | 100 | 100 | — | — |
| | | Compound 2 | — | — | — | — | — | 100 | — |
| | | Compound 3 | — | — | — | — | — | — | 100 |
| | | Compound 4 | — | — | — | — | — | — | — |
| | | Cyclomer P | — | — | — | — | — | — | — |
| | (B) | Ik-1 | 8 | 8 | 8 | 8 | 8 | 8 | 8 |
| | (C) | Dispersion 1 | 300 | — | — | — | 300 | 300 | 300 |
| | | Dispersion 2 | — | 300 | — | — | — | — | — |
| | | Dispersion 3 | — | — | 150 | — | — | — | — |
| | | Dispersion 4 | — | — | — | 200 | — | — | — |
| | (D) | KR-470 | 30 | 30 | 30 | 30 | — | 30 | 30 |
| | | FA-731A | — | — | — | — | — | — | — |
| | (E) | DBA | 8 | 8 | 8 | 8 | 8 | 8 | 8 |
| Solvent | | PGMEA | 60 | 60 | 150 | 120 | 60 | 60 | 60 |
| Pigment concentration (%) | | Pigment/(A) | 60 | 60 | 30 | 40 | 60 | 60 | 60 |
| | | Pigment/(total solid content) | 26 | 26 | 16 | 20 | 30 | 26 | 26 |
| Evaluation results | | Film formability | A | A | A | A | A | A | A |
| | | Sensitivity (mJ/cm$^2$) | 80 | 80 | 80 | 80 | 300 | 80 | 80 |
| | | Developability | A | A | A | A | A | B | B |
| | | OD | 2.0 | 2.0 | 2.0 | 2.0 | 2.0 | 2.0 | 2.0 |
| | | Heat resistance | A | A | A | A | A | A | A |

| | | | Comparative Example 1 | Comparative Example 2 | Comparative Example 3 | Reference example 1 | Reference example 2 |
|---|---|---|---|---|---|---|---|
| Composition | (A) | Compound 1 | — | — | 100 | 100 | — |
| | | Compound 2 | — | — | — | — | 100 |
| | | Compound 3 | — | — | — | — | — |
| | | Compound 4 | 100 | — | — | — | — |
| | | Cyclomer P | — | 100 | — | — | — |
| | (B) | Ik-1 | 8 | 8 | 8 | 2 | 2 |
| | (C) | Dispersion 1 | 300 | 300 | 15 | — | — |
| | | Dispersion 2 | — | — | — | — | — |
| | | Dispersion 3 | — | — | — | — | — |
| | | Dispersion 4 | — | — | — | — | — |
| | (D) | KR-470 | 30 | — | 30 | 30 | 30 |
| | | FA-731A | — | 30 | — | — | — |

TABLE 2-continued

| | (E) | DBA | 8 | 8 | 8 | 2 | 2 |
|---|---|---|---|---|---|---|---|
| | Solvent | PGMEA | 60 | 60 | 290 | 300 | 300 |
| | Pigment concentration (%) | Pigment/(A) | 60 | 60 | 3 | 0 | 0 |
| | | Pigment/(total solid content) | 26 | 26 | 2 | 0 | 0 |
| Evaluation results | | Film formability | X | A | A | A | A |
| | | Sensitivity (mJ/cm$^2$) | 300 | 300 | 40 | 20 | 20 |
| | | Developability | — | A | A | A | A |
| | | OD | — | 2.0 | 0.2 | — | — |
| | | Heat resistance | — | X | A | A | A |

The compositions of Examples 1-7 were all excellent in film formability, and the resulting cured films had excellent heat resistance and light shielding property. The composition of Comparative Example 1 in which a chain siloxane was used as the component (A) had a low film formability and a uniform film could not be obtained. The composition of Comparative Example 2 in which an acrylic resin was used as the component (A) was excellent in film formability and developability, but the heat resistance was insufficient. In the composition of Comparative Example 3, since a blending amount of a pigment was small, the light shielding property was insufficient.

Example 1 and Example 2 in each of which an organic pigment was used, and Example 3 and Example 4 in each of which an inorganic pigment was used, were all excellent in film formability, developability, light shielding property, and heat resistance. From these results, it can be seen that the composition of the present invention can form a colored pattern excellent in various properties without depending on the type of the coloring agent.

Example 5 was excellent in film formability, developability, light shielding property, and heat resistance, similar to Example 1, but, the exposure amount required to form a good pattern was large (the exposure time was long), and the photosensitivity was lower as compared to Example 1. In Comparative Example 1 and Comparative Example 2, similar to Example 1, despite that a reactive diluent was blended, the photosensitivity was comparable to that of Example 5 in which a reactive diluent was not blended. From these results, it can be seen that when a compound having a cyclic polysiloxane structure and a cationically polymerizable functional group is used as the component (A), the photosensitivity is specifically improved. In Comparative Example 3 in which a blending amount of a pigment was small, the photosensitivity was higher as compared to Example 1, and in Reference Example 1 in which a pigment was not contained, the photosensitivity was further increased. From these results, it can be seen that absorption of exposure light and reduction in density of crosslinking points by the coloring agent blended in the composition are factors causing a decrease in photosensitivity.

From the above results, it can be seen that, in a negative type photosensitive composition for forming a colored pattern, although photosensitivity decreases due to the presence of a coloring agent, by blending a reactive diluent in the composition, the photosensitivity improves and a good pattern can be formed even at a low exposure amount.

Figure 1B:

In Example 6 in which the compound 2 was used as the component (A) and in Example 7 in which the compound 3 was used, although a good pattern was formed by alkali development, during the development, the film of the unexposed portion was removed so as to peel off from the substrate, and, as shown in FIG. 1B, an undissolved solid matter in the developer was confirmed. On the other hand, in Reference Example 2 in which the compound 2 was used as the component (A) and a pigment was not contained, similar to Examples 1-5, high alkali solubility was exhibited. From these results, it is thought that, although the compound 2 and the compound 3 each exhibit high alkali solubility as a single substance, the solubility of the film in the alkali developer was lowered due to dispersibility or the like when the coloring agent was blended.

In the examples in which the compound 1 was used as the component (A), in the case where a coloring agent was blended (Examples 1-5), a solubility in an alkali developer comparable to that in the case where a coloring agent was not blended (Reference Example 1) was also exhibited. From these results, it can be seen that, by using the compound 1 as the component (A), even when a blending amount of a coloring agent is large, a good alkali solubility is exhibited. It is thought that this is because the introduction of the glycidyl group into the polysiloxane compound had improved the dispersibility of the coloring agent.

What is claimed is:
1. A photosensitive composition, comprising:
a polysiloxane compound;
a photoacid generator;
a coloring agent; and
a solvent,
wherein the polysiloxane compound comprises a cyclic polysiloxane structure and a cationically polymerizable functional group,
the polysiloxane compound comprises an alicyclic epoxy group and a glycidyl group in one molecule as the cationically polymerizable functional group, and
a content of the coloring agent is 5% by weight or more based on a total solid content.
2. The photosensitive composition according to claim 1, wherein a content of the polysiloxane compound is from 20% to 80% by weight based on the total solid content.
3. The photosensitive composition according to claim 1, wherein the polysiloxane compound further comprises an alkali-soluble functional group.
4. The photosensitive composition according to claim 3, wherein the alkali-soluble functional group has the following structure X1 or X2:

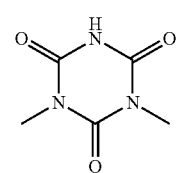

X1

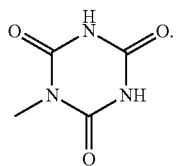
X2

5. The photosensitive composition according to claim 4, wherein the alkali-soluble functional group has the structure of X1.

6. The photosensitive composition according to claim 5, further comprising:
a reactive diluent having at least two cationically polymerizable functional groups in one molecule.

7. The photosensitive composition according to claim 6, wherein a content of the reactive diluent is from 10 to 150 parts by weight based on 100 parts by weight of the polysiloxane compound.

8. The photosensitive composition according to claim 6, wherein a content of the reactive diluent is from 20 to 70 parts by weight with based on 100 parts by weight of the polysiloxane compound.

9. The photosensitive composition according to claim 4, wherein the alkali-soluble functional group has the structure of X2.

10. The photosensitive composition according to claim 9, further comprising:
a reactive diluent having at least two canonically polymerizable functional groups in one molecule.

11. The photosensitive composition according to claim 10, wherein a content of the reactive diluent is from 10 to 15 parts by weight with based on 100 parts by weight of the polysiloxane compound.

12. The photosensitive composition according to claim 10, wherein a content of the reactive diluent is from 20 to 70 parts by weight with based on 100 parts by weight of the polysiloxane compound.

13. The photosensitive composition according to claim 1, further comprising:
a reactive diluent comprising at least two cationically polymerizable functional groups in one molecule.

14. The photosensitive composition according to claim 13, wherein the at least two cationically polymerizable functional groups of the reactive diluent are alicyclic epoxy groups.

15. The photosensitive composition according to claim 13, wherein a content of the reactive diluent is from 5% to 75% by weight based on the total solid content.

16. A colored pattern, comprising:
a cured product of the photosensitive composition of claim 1.

17. A method for producing a colored pattern, comprising:
applying the photosensitive composition of claim 1 on a substrate; and
performing patterning by exposure and development.

* * * * *